(12) United States Patent
Luoh

(10) Patent No.: US 7,148,105 B2
(45) Date of Patent: Dec. 12, 2006

(54) METHOD FOR FORMING POLYSILICON FLOATING GATE

(75) Inventor: Tuung Luoh, Taipei (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 11/013,089

(22) Filed: Dec. 15, 2004

(65) Prior Publication Data

US 2005/0158976 A1    Jul. 21, 2005

Related U.S. Application Data

(62) Division of application No. 10/180,168, filed on Jun. 26, 2002, now abandoned.

(51) Int. Cl.
*H01L 21/336* (2006.01)

(52) U.S. Cl. .................... 438/257; 438/468

(58) Field of Classification Search ............. 438/257, 438/486
See application file for complete search history.

(56) References Cited

U.S. PATENT DOCUMENTS

| | | | |
|---|---|---|---|
| 4,748,133 A | 5/1988 | Griswold | |
| 4,945,393 A | 7/1990 | Beltram et al. | |
| 4,963,506 A | 10/1990 | Liaw et al. | |
| 5,017,308 A | 5/1991 | Iijima et al. | |
| 5,017,980 A | 5/1991 | Gill et al. | |
| 5,147,813 A | 9/1992 | Woo | |
| 5,445,982 A | 8/1995 | Hwang | |
| 5,711,998 A | 1/1998 | Shufflebotham | |
| 5,751,637 A | 5/1998 | Chen et al. | |
| 5,753,134 A | 5/1998 | Biebl | |
| 5,863,706 A | 1/1999 | Komatsu et al. | |
| 5,874,129 A | 2/1999 | Beinglass et al. | |
| 5,972,765 A | 10/1999 | Clark et al. | |
| 6,013,551 A | 1/2000 | Chen et al. | |
| 6,023,093 A | 2/2000 | Gregor et al. | |
| 6,114,722 A | 9/2000 | Jan et al. | |
| 6,143,632 A | 11/2000 | Ishida et al. | |
| 6,218,245 B1 | 4/2001 | Xiang et al. | |
| 6,221,705 B1 | 4/2001 | Rost et al. | |
| 6,252,270 B1 | 6/2001 | Gregor et al. | |
| 6,268,068 B1 | 7/2001 | Heuer et al. | |
| 6,268,086 B1 | 7/2001 | Honbo et al. | |
| 6,326,274 B1 | 12/2001 | Rost et al. | |
| 6,373,092 B1 | 4/2002 | Okumoto | |
| 6,509,217 B1 * | 1/2003 | Reddy | 438/153 |
| 6,670,241 B1 | 12/2003 | Kamal et al. | |
| 6,861,339 B1 | 3/2005 | Chen et al. | |
| 2004/0007733 A1 | 1/2004 | Luoh | |

OTHER PUBLICATIONS

Mitani, Y., et al., "Highly Reliable Gate Oxide under Fowler-Nordheim Electron Injectionby Deuterium Pyrogentic Oxidation and Deuterated Poly-Si Deposition", Dec. 10, 2000, IEDM Tech. Dig. Inter., p. 343-6.*

(Continued)

*Primary Examiner*—Howard Weiss
(74) *Attorney, Agent, or Firm*—Mark A. Haynes; Haynes Beffel + Wolfeld LLP

(57) ABSTRACT

A floating gate memory cell comprises a substrate with a drain and a source separated by a channel, a floating gate separated from the channel by a first insulation layer, and a control gate separated from the floating gate by a second insulation layer. The deposition environment is chosen so that the grain size of at least a portion of the floating gate opposite the first insulation layer is about 50–500 Å.

33 Claims, 2 Drawing Sheets

OTHER PUBLICATIONS

Kwon, Hyungshin et al., "Electrical Characteristics of Ultrathin Gate Oxide Prepared by Postoxidation Anealing in ND3," Appl. Phys. Let. 76:6, 772-773 (Feb. 7, 2000).

Dorsch, Jeff, "Applied Debuts RTP System," Electronic News, Sep. 20, 1999, 3 pages.

"Characterizing Very Thin ONO Gates with Laser Spectroscopic Ellipsometry" Rudolph Technologies, Inc. Application Reports (2001) http://www.rudolphtech.com/reports/VeryThinONOGates.htm, 3 pages.

Lammers, David, "Chip makers bang away at metal gates," EETIMES, Nov. 26, 2002, 3 pages.

Dipert, Brian, "Exotic Memories, Diverse Approaches," EDN, Apr. 26, 2001, 56-70.

Wilson, Ron, "Flash gets a quantum makeover at IEDM," EETIMES, Dec. 13, 2002, 4 pages.

"Polysilicon: The Successor Technology," http://www.wtec.org/loyola/dsply_jp/c5_s5.htm (Jun. 1992), 3 pages.

Kahler, U. et al., "Size related Properties of silicon nanoparticles from decomposition of SiOx," Max-Planck-Institut für Mikrostrukturphysik, 2000 Annual Report, 38-39. http://www.mpi-halle.mpg.de/annual_reports/2000.pdf/jb_results_14.pdf.

Minch, Bradley A., "The K-Input Floating-Gate MOS (FGMOS) Transistor" Sep. 20, 2002, http://people.ece.cornell.edu/minch/talks/FGMOSTdevicelayout.pdf, 22 pages.

"Flash Memory Technology," Integrated Circuit Engineering Corporation (1997) 10-1 through 10-16. http://smithsonianchips.si.edu/ice/cd/MEMORY97/SEC10.PDF.

"The future is clear with Toshiba: Polysilicon", accessed Nov. 3, 2004, http://www/toshiba-europe.com/computers/tnt/tft, 1 page.

Higher Resolution, The Future is clear with Toshiba, http://www.toshiba-europe.com/computers/tnt/tft/resolution.htm (2002), 1 page.

Polysilicon TFT, The Future is clear with Toshiba, http://www.toshiba-europe.com/computers/tnt/tft/ (2002), 1 page.

Polysilicon Explained, The future is clear with Toshiba, http://www.toshiba-europe.com/computers/tnt/tft/explained.htm (2002), 1 page.

* cited by examiner

METHOD FOR FORMING POLYSILICON FLOATING GATE

RELATED APPLICATIONS

This application is a division of application Ser. No. 10/180,168 filed 26 Jun. 2002, now abandoned.

BACKGROUND OF THE INVENTION

One type of integrated circuit (IC) memory is called eraseable programmable read-only memory (EPROM). This type of memory permits the user to program the memory and, if desired, erase and reprogram memory. One type of EPROM is an N-channel metal oxide semiconductor field effect transistor (MOSFET), one example of which is shown in FIGS. 1 and 2, comprising a floating gate transistor 10 with two gates 12, 14 made of polysilicon. Polysilicon is commonly deposited by the thermal decomposition (pyrolysis) of silane ($SiH_4$) or disilane ($Si_2H_6$) at about 520–700° C. using low-pressure chemical vapor deposition (LPCVD) techniques. The deposition at lower temperatures, such as 520° C., results in the deposited polysilicon being amorphous; the amorphous polysilicon can be recrystallized by subsequent annealing procedures, such as at about 900–1000° C. Gate 12 is a select or control gate while gate 14 is a floating gate. Transistor 10 comprises a substrate 16 including a source 18 and a drain 20 separated from one another by a channel 22. Floating gate 14 is separated from channel 22 by a first insulation layer 24, also called the gate oxide 24, while control gate 12 is separated from floating gate 14 by a second insulation layer 26.

FIG. 1 illustrates a conventional method for programming transistor 10. The arrow in FIG. 1 illustrates channel hot electron injection into floating gate 14 from channel 22 adjacent to drain 20 and through first insulation layer 24 causing a negative charge to be trapped within floating gate 14. The existence of the negative charge within floating gate 14 causes the threshold voltage of the programming transistor to the higher than prior to programming. The programmed transistor retains its programmed state even when the power supply is turned off; it has been estimated that the programmed device will retain its programmed state for as long as 100 years. FIG. 2 illustrates the erasing of transistor 10. The arrow in FIG. 2 suggests Fowler-Nordheim (FN) electron tunneling current through first insulation layer 24 and into source 18 (or along channel 22). Transistor 10 is read by applying a voltage between high and low threshold values to control gate 12. If transistor 10 is programmed, that is storing a 0, it will not conduct; if transistor 10 is not programmed, that is storing a 1, it will freely conduct.

SUMMARY OF THE INVENTION

The present invention is based on the recognition that the frequency of erratic erase may be decreased when the grain size of the polysilicon material constituting the floating gate is reduced.

A first aspect of the invention is directed to a floating gate memory cell of the type comprising a substrate with a drain and a source separated by a channel, a floating gate separated from the channel by a first insulation layer, and a control gate separated from the floating gate by a second insulation layer. The floating gate is a microcrystalline polysilicon material having a grain size of between about 50–500 Å. The grain size may also be between about 50–300 Å or 200–500 Å.

A second aspect of the invention is directed to a method for forming a polysilicon floating gate during the manufacture of a floating gate memory cell using a deposition process. The improved method comprises selecting a reaction gas and, optionally, a second gas for forming the floating gate during the deposition process, consisting essentially of a reaction gas SiX or $Si_2Y$ or an appropriate combination thereof, and, optionally, a second gas Z, where at least one of X, Y and Z comprises deuterium (D); and forming a microcrystalline polysilicon floating gate using said selected reaction gas/second gas. X may comprise at least one of: $H_4$, $H_2Cl_2$, $HCl_3$, $D_4$, $D_2Cl_2$, $D_3Cl$. Y may comprise at least one of: $H_6$, $H_4Cl_2$, $H_2Cl_4$, $D_6$, $D_4Cl_2$, $D_{2Cl4}$. Z is used primarily to reduce grain size and may comprise at least one of: $D_2$, $H_2$, $D_3$. The floating gate may be deposited with a desired microcrystalline polysilicon grain structure. The floating gate may be deposited in an amorphous state and then treated to exhibit a desired microcrystalline polysilicon grain structure.

A third aspect of the invention is directed to a method for forming a polysilicon floating gate during the manufacture of a floating gate memory cell using a deposition process. The method comprises selecting a reaction gas and, optionally, a second gas for forming the floating gate during the deposition process consisting essentially of a reaction gas SiX and, optionally, a second gas Y. The selecting step is carried out with X comprising at least one of: $H_4$, $H_2Cl_2$, $HCl_3$, $D_4$, $D_2Cl_2$, $D_3Cl$ and Y comprising at least one of: $D_2$, $H_2$, $D_3$. The method further comprises forming a microcrystalline polysilicon floating gate using said selected reaction gas/second gas. The forming step may comprise depositing the amorphous silicon material for the floating gate and then treating the floating gate material to exhibit a desired microcrystalline polysilicon grain structure, such as about 200–500 Å.

A fourth aspect of the invention is directed to a method for forming a polysilicon floating gate during the manufacture of a floating gate memory cell using a deposition process. The method comprises selecting a reaction gas and, optionally, a second gas for forming the floating gate during the deposition process consisting essentially of a reaction gas $Si_2X$ and, optionally, a second gas Y. The selecting step is carried out with X comprising at least one of: $H_6$, $H_4Cl_2$, $H_2Cl_4$, $D_6$, $D_4Cl_2$, $D_2Cl_4$ and Y comprising at least one of: $D_2$, $H_2$, $D_3$. The method further comprises forming a microcrystalline polysilicon floating gate using said selected reaction gas/second gas. The forming step may comprise depositing the amorphous silicon material for the floating gate and then treating the floating gate material to exhibit a desired microcrystalline polysilicon grain structure, such as about 200–500 Å.

A fifth aspect of the invention is directed to a method for forming a polysilicon floating gate during the manufacture of a floating gate memory cell using a deposition process, the floating gate memory cell of a type comprising a substrate with a drain and a source separated by a channel, a floating gate separated from the channel by a first insulation layer, and a control gate separated from the floating gate by a second insulation layer. A deposition environment is chosen to include selecting a reaction gas, selecting a reaction gas flow rate, selecting a deposition pressure, and selecting a deposition time. A microcrystalline polysilicon floating gate is formed with the selecting steps chosen so that the grain size of at least a portion of the floating gate opposite the first insulation layer is about 50–500 Å. The entire floating gate may have a grain size of about 50–500 Å. The selecting steps may also be carried out so that the grain size is between about 50–300 Å. The reaction gas selecting step may comprise selecting a reaction gas and, optionally, a second gas consisting essentially of a reaction gas SiX or $Si_2Y$ or an appropriate combination thereof, and, optionally, a second gas Z, where at least one of X, Y and Z comprises deuterium (D). The reaction gas-selecting step may be carried out with X comprising at least one of: $H_4$, $H_2Cl_2$, $HCl_3$, $D_4$, $D_2Cl_2$, $D_3Cl$. The reaction gas-selecting step may also be carried out with Y comprise at least one of: $H_6$, $H_4Cl_2$, $H_2Cl_4$, $D_6$, $D_4Cl_2$, $D_2Cl_4$. The reaction gas-selecting step may be carried out with Z comprising at least one of: $D_2$, $H_2$, $D_3$.

Other features and advantages of the present invention will appear from the following description in which preferred embodiments are disclosed in detail in conjunction with the accompanying drawings.

DETAILED DESCRIPTION OF THE INVENTION

One of the most common failure modes of an individual floating gate transistor within an integrated circuit memory is called erratic erase. Erratic floating gate transistors show an unstable and unpredictable behavior in erasing. Erratic erase can cause an over erase condition. An over erase condition can cause a memory cell to be stuck as a 1 so that it cannot be programmed. The present invention is based on the concept that making at least the portion of the floating gate opposite the first insulation layer to be a microcrystalline polysilicon material with a controlled, small grain size will help eliminate erratic erase and lead to uniform erase speed.

Figure 1:
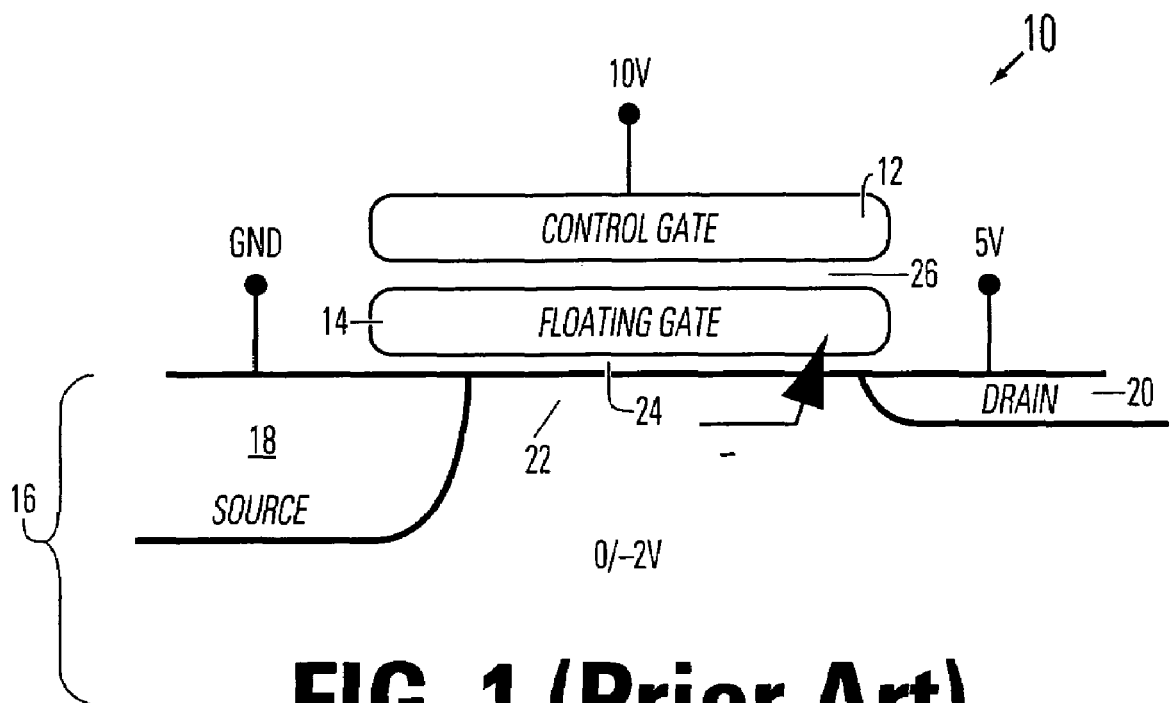
FIG. 1 illustrates a prior art floating gate transistor in a programming mode.
Figure 3:
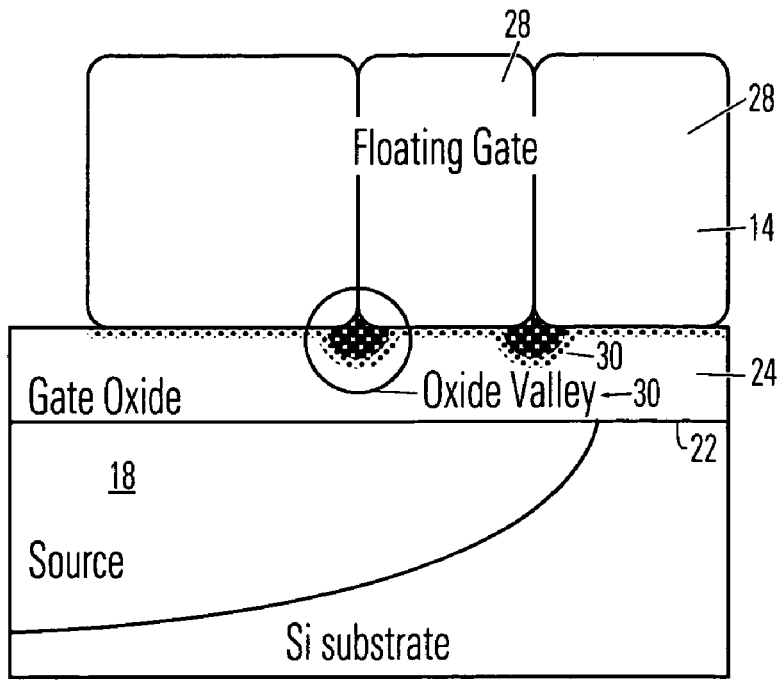
FIG. 3 is an enlarged, simplified view of a portion of the transistor of FIG. 1.

FIG. 3 is an enlarged, simplified view of a portion of transistor 10 of FIG. 1 illustrating the relatively large grains 28 of the polysilicon material constituting that portion of floating gate 14 adjacent to first insulation layer 24. Conventional deposition processes create grains 28 having a grain size range from about 600–3000 Å. Also illustrated is what is termed an oxide valley 30 in first insulation layer 24 at the intersection of adjacent grains 28.

Figure 2:
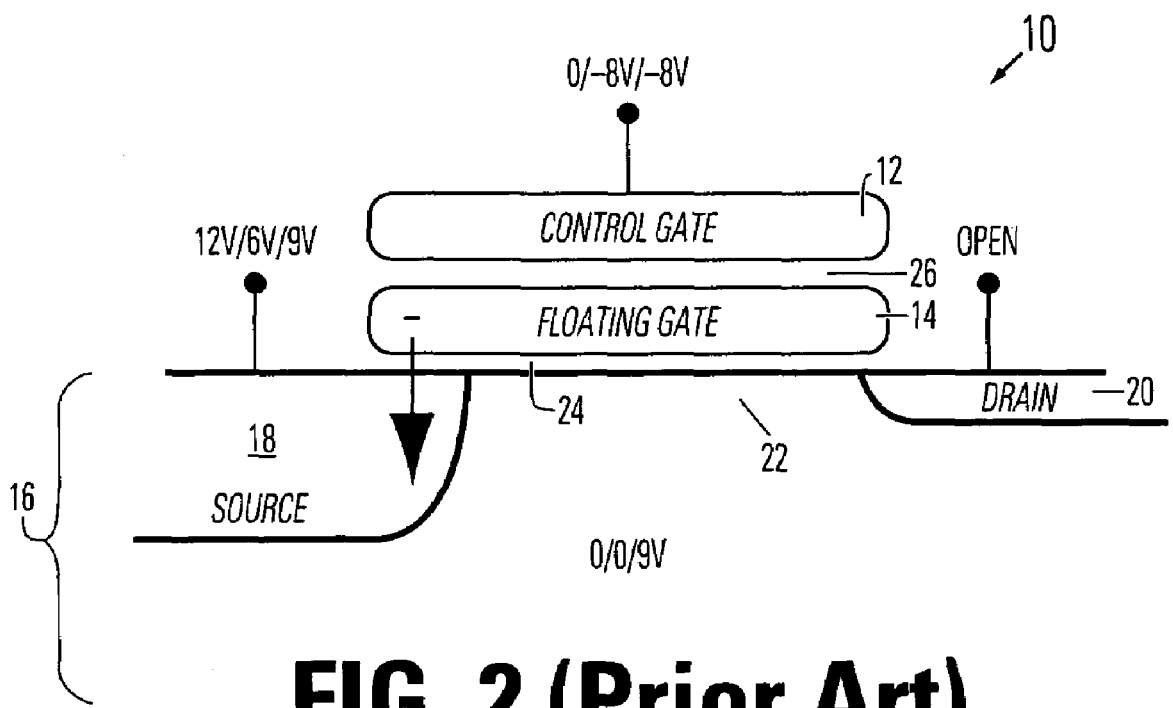
FIG. 2 illustrates the floating gate transistor of FIG. 1 in an erase mode.
Figure 4:
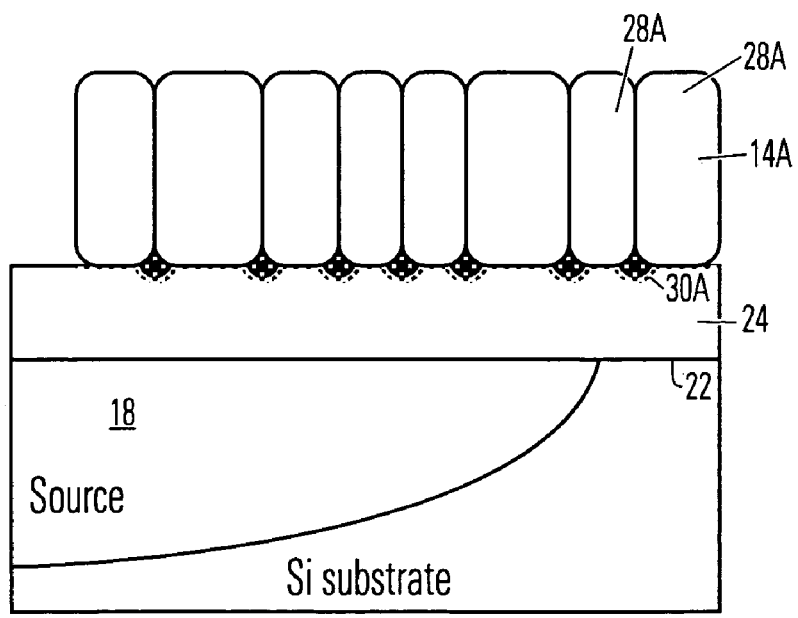
FIG. 4 is a view, similar to that of FIG. 3, of a portion of a floating gate transistor made according to the invention illustrating the smaller grains of the floating gate.

FIG. 4 is a view, similar view to that of FIG. 3, of a portion of a floating gate transistor made according to the invention. A floating gate transistor made according to the invention is typically substantially identical to the conventional floating gate transistor 10 of FIGS. 1–3, except that floating gate 14A comprises much smaller grains 28A and smaller oxide valleys 30A than floating gate 14. A high density of phosphorous oxide region is designed as "oxide valley". Floating gate 14A is a microcrystalline polysilicon material having a grain size of between about 50–500 Å, and preferably between about 50–300 Å. It is believed that having much smaller grains 28A leads to smaller valleys 30A. The smaller grain size helps to decrease the erratic erase problems and leads to a more uniform erase speed. The barrier height or electron trapping will be reduced at the poly-Si/$O_2$ interface due to the smaller oxide valley. The provision of smaller grains 28A, which as illustrated are somewhat randomly sized, can also help make transistor 10 resistant to trap generation by hot electron impingement.

The invention is typically carried out using an LPCVD deposition process. One such LPCVD process, known as the furnace process, is carried out at a temperature of about 500–700° C. and a pressure of about 0.1 mtorr-5 torr. Another LPCVD process, known as the single wafer process, is carried out at a temperature of about 580–800° C. and a pressure of about 10–500 torr. The floating gate may be deposited with a desired microcrystalline polysilicon grain structure. However, when the deposition takes place at temperatures below about 580° C., the deposited floating gate material may be amorphous and will need to be treated, typically annealed, to achieve the desired microcrystalline polysilicon grain structure. When the floating gate is deposited in an amorphous state and then treated to exhibit a desired microcrystalline polysilicon grain structure, the resulting grain size is typically about 200–500 Å. The invention may be carried out using deposition processes other than LPCVD, such as PECVD (plasma enhance CVD), to achieve the desired grain structure.

Most of the steps in the formation of floating gate transistor 10 as part ot an integrated circuit memory device are generally conventional. However, the polysilicon floating gate 14A is formed by first selecting a reaction gas and, optionally, a second gas for forming the floating gate during the deposition process. The gas consists essentially of a reaction gas SiX or $Si_2Y$ or an appropriate combination thereof, and, optionally, a second gas Z. At least one of X, Y and Z may comprise deuterium (D). X comprises at least one of: $H_4$, $H_2Cl_2$, $HCl_3$, $D_4$, $D_2Cl_2$, $D_3Cl$. Y comprises at least one of: $H_6$, $H_4Cl_2$, $H_2Cl_4$, $D_6$, $D_4Cl_2$, $D_2Cl_4$. Z comprises at least one of: $D_2$, $H_2$, $D_3$.

In comparing the use of $SiH_4/H_2$, $SiH_4/D_2$, $SiD_4/H_2$, and $SiD_4/D_2$, the following has been found. (The test conditions included temperature:640~770C, pressure: 200~400 torr, and $SiH_4$ at 10~1000 sccm). $SiH_4$ (1) does not create a floating gate 14A having a desired microcrystalline polysilicon grain structure, and (2) does not create a floating gate 14A resistant to trap generation by hot electron impingement. $SiH_4/H_2$(1) does create a floating gate 14A having a desired microcrystalline polysilicon grain structure, and (2) does not create a floating gate 14A resistant to trap generation by hot electron impingement. $SiH_4/D_2$ (1) does create a floating gate 14A having a desired microcrystalline polysilicon grain structure, and (2) does create a floating gate 14A resistant to trap generation by hot electron impingement. $SiD_4/H_2$ (1) does create a floating gate 14A having a desired microcrystalline polysilicon grain structure, and (2) does create a floating gate 14A resistant to trap generation by hot electron impingement. $SiD_4/D_2$ (1) does create a floating gate 14A having a desired microcrystalline polysilicon grain structure, and (2) does create a floating gate 14A resistant to trap generation by hot electron impingement. Of these compositions, $SiD_4/D_2$ appears to be the best.

The effect of $H_2$ flow on grain size appears to be that grain size decreases as $H_2$ flow increases. For example, testing was done at 720C, 275 torr, 24sec deposition to 1000A thickness in a single-wafer POLYgen chamber using $SiH_4/H_2$. A flow rate ratio for $SiH_4/H_2$ of 100 sccm/0 sccm resulted in a grain size of about 600–800 Å. A flow rate ratio for $SiH_4/H_2$ of 100 sccm/1000 sccm resulted in a grain size of about 200–400 Å A flow rate ratio for $SiH_4/H_2$ of 100 sccm/2000 sccm resulted in a grain size of about 50–200 Å. In another example, testing was done in a single-wafer POLYgen chamber at 640C, 275 torr using SiH$_4$/H$_2$ for 38sec deposition to 1000A thickness, and then RTP at 950C 30sec in N2 ambient. A flow rate ratio for SiH$_4$/H$_2$ of 200 sccm/0 sccm resulted in a grain size of about 800~1000 Å. A flow rate ratio for SiH$_4$/H$_2$ of 200 sccm/1000sccm resulted in a grain size of about 400~600 Å. A flow rate ratio for SiH$_4$/H$_2$ of 200 sccm/2000 sccm resulted in a grain size of about 200~300 Å.

Modification and variation can be made to be disclosed embodiments without the departing from the subject of the invention as defined in the following claims.

Any and all patents, patent applications and printed publications referred to above are incorporated by reference.

What is claimed is:

1. A method for forming a polysilicon floating gate during the manufacture of a floating gate memory cell using a deposition process, comprising:
   selecting a reaction gas and a second gas for forming the floating gate during the deposition process consisting essentially of a reaction gas SiX or Si$_2$Y or a combination thereof, and a second gas Z;
   selecting a flow rate ratio for the reaction gas to the second gas of 1/5 to 1/20; and
   forming a microcrystalline polysilicon floating gate using said selected reaction gas/second gas.

2. The method according to claim 1 wherein the selecting step is carried out with X comprising at least one of: H$_4$, H$_2$Cl$_2$, HCl$_3$, D$_4$, D$_2$Cl$_2$, D$_3$Cl.

3. The method according to claim 1 wherein the selecting step is carried out with Y comprising at least one of: H$_6$, H$_4$Cl$_2$, H$_2$Cl$_4$, D$_6$, D$_4$Cl$_2$, D$_2$Cl$_4$.

4. The method according to claim 1 wherein the selecting step is carried out with Z comprising at least one of: D$_2$, H$_2$, D$_3$.

5. The method according to claim 1 wherein the selecting step is carried out with the reaction gas/second gas being SiD$_4$/D$_2$.

6. The method according to claim 1 wherein the selecting step is carried out with the reaction gas/second gas being Si$_2$D$_6$/D$_2$.

7. The method according to claim 1 wherein the selecting step is carried out with the reaction gas/second gas comprising at least one of the following: SiD$_4$/D$_2$, SiD$_4$/H$_2$, SiH$_4$/D$_2$.

8. The method according to claim 1 wherein the selecting step is carried out with the reaction gas/second gas comprising at least one of the following: Si$_2$D$_6$/D$_2$, Si$_2$D$_6$/H$_2$, Si$_2$H$_6$/D$_2$.

9. The method according to claim 1 wherein the forming step comprises:
   depositing an amorphous silicon material for the floating gate; and then
   treating the amorphous silicon floating gate material to exhibit a desired microcrystalline polysilicon grain structure.

10. The method according to claim 9 wherein the treating step is carried out so that the microcrystalline polysilicon floating gate has a grain size of about 200–500 Å.

11. The method according to claim 9 wherein the treating step is carried out by subjecting the amorphous silicon floating gate material to a temperature above about 600° C.

12. The method according to claim 1 wherein the forming step takes place with the polysilicon material being deposited with a desired microcrystalline polysilicon grain structure.

13. The method according to claim 1 wherein the selecting and forming steps are carried out during an LPCVD procedure.

14. The method according to claim 13 wherein the LPCVD process comprises a chosen one of the following processes: furnace, single wafer.

15. The method according to claim 13 wherein the LPCVD process comprises a furnace process carried out at a pressure from about 0.1 milliTorr to about 5 Torr and at a temperature of about 500° C. to about 700° C.

16. The method according to claim 13 wherein the LPCVD process comprises a single wafer process carried out at a pressure from about 10 Torr to about 500 Torr and at a temperature of about 580° C. to about 800° C.

17. The method according to claim 1 wherein the forming step is carried out so that the microcrystalline polysilicon floating gate has a grain size of about 5014 500 Å.

18. The method according to claim 1 wherein the forming step is carried out so that the microcrystalline polysilicon floating gate has a grain size of about 50–300 Å.

19. A method for forming a polysilicon floating gate during the manufacture of a floating gate memory cell using a deposition process, comprising:
   selecting a reaction gas and a second gas for forming the floating gate during the deposition process consisting essentially of a reaction gas SiX and a second gas Y;
   the selecting step being carried out with X comprising at least one of: H$_4$, H$_2$Cl$_2$, HCl$_3$, D$_4$, D$_2$Cl$_2$, D$_3$Cl and Y comprising at least one of: D$_2$, H$_2$, D$_3$;
   selecting a flow rate ratio for the reaction gas to the second gas of 1/5 to 1/20; and
   forming a microcrystalline polysilicon floating gate using said selected reaction gas/second gas.

20. The method according to claim 19 wherein the forming step comprises:
   depositing an amorphous silicon material for the floating gate; and then
   treating the amorphous silicon floating gate material to exhibit a desired microcrystalline polysilicon grain structure.

21. The method according to claim 20 wherein the treating step is carried out so that the microcrystalline polysilicon floating gate has a grain size of about 200–500 Å.

22. The method according to claim 19 wherein the forming step takes place with the polysilicon material being deposited with a grain size of about 50–300 Å.

23. The method according to claim 19 wherein at least one of X and Y comprises deuterium (D).

24. A method for forming a polysilicon floating gate during the manufacture of a floating gate memory cell using a deposition process, comprising:
   selecting a reaction gas and a second gas for forming the floating gate during the deposition process consisting essentially of a reaction gas Si$_2$X and a second gas Y;
   the selecting step being carried out with X comprising at least one of: H$_6$, H$_4$Cl$_2$, H$_2$Cl$_4$, D$_6$, D$_4$Cl$_2$, D$_2$Cl$_4$ and Y comprising at least one of: D$_2$, H$_2$, D$_3$;
   selecting a flow rate ratio for the reaction gas to the second gas of 1/5 to 1/20; and
   forming a microcrystalline polysilicon floating gate using said selected reaction gas/second gas.

25. The method according to claim 24 wherein the forming step comprises:
   depositing an amorphous silicon material for the floating gate; and then treating the amorphous silicon floating gate material to exhibit a desired microcrystalline polysilicon grain structure.

26. The method according to claim 25 wherein the treating step is carried out so that the microcrystalline polysilicon floating gate has a grain size of about 200–500 Å.

27. The method according to claim 24 wherein the forming step takes place with the polysilicon material being deposited with a grain size of about 50–300 Å.

28. The method according to claim 24 wherein at least one of X and Y comprises deuterium (D).

29. The method according to claim 1 wherein the flow rate selecting step comprises selecting a flow rate ratio for the reaction gas to the second gas of 1/10 to 1/20.

30. The method according to claim 19 wherein the flow rate selecting step comprises selecting a flow rate ratio for the reaction gas to the second gas of 1/10 to 1/20.

31. The method according to claim 24 wherein the flow rate selecting step comprises selecting a flow rate ratio for the reaction gas to the second gas of 1/10 to 1/20.

32. The method according to claim 1 wherein the forming step is carried out at a pressure of 200–400 torr.

33. the method according to claim 32 wherein the selecting step is carried out with Z comprising at least one of $D_2$ and $H_2$, with SiX comprising $SiH_4$, and with $Si_2Y$ comprising $Si_2H_6$.

* * * * *